(12) United States Patent
Shibata

(10) Patent No.: US 11,996,376 B2
(45) Date of Patent: May 28, 2024

(54) SEMICONDUCTOR STORAGE DEVICE

(71) Applicant: KIOXIA CORPORATION, Tokyo (JP)

(72) Inventor: Junichi Shibata, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 253 days.

(21) Appl. No.: 17/189,234

(22) Filed: Mar. 1, 2021

(65) Prior Publication Data
US 2022/0059481 A1 Feb. 24, 2022

(30) Foreign Application Priority Data

Aug. 20, 2020 (JP) .................................. 2020-139279

(51) Int. Cl.
| H01L 21/768 | (2006.01) |
| H01L 21/762 | (2006.01) |
| H01L 23/00 | (2006.01) |
| H01L 25/065 | (2023.01) |
| H01L 25/18 | (2023.01) |

(52) U.S. Cl.
CPC .......... H01L 24/08 (2013.01); H01L 25/0657 (2013.01); H01L 25/18 (2013.01); *H01L 2224/08145* (2013.01); *H01L 2924/1431* (2013.01); *H01L 2924/14511* (2013.01)

(58) Field of Classification Search
CPC ........... H01L 25/18; H01L 2224/08145; H01L 24/08; H01L 2224/80895; H01L 2224/80896
See application file for complete search history.

(56) References Cited

U.S. PATENT DOCUMENTS

| 10,916,533 | B2 | 2/2021 | Baik | |
| 11,270,987 | B2* | 3/2022 | Park | .................... H01L 27/0688 |
| 2019/0279952 | A1 | 9/2019 | Tagami | |
| 2020/0013767 | A1 | 1/2020 | Baik | |
| 2020/0203329 | A1* | 6/2020 | Kanamori | .............. H10B 43/27 |
| 2020/0243455 | A1* | 7/2020 | Wang | ..................... H10B 41/27 |

(Continued)

FOREIGN PATENT DOCUMENTS

| JP | 2018-026518 A | 2/2018 |
| TW | 201939720 A | 10/2019 |

(Continued)

*Primary Examiner* — Anthony Ho
*Assistant Examiner* — David J Goodwin
(74) *Attorney, Agent, or Firm* — Kim & Stewart LLP

(57) ABSTRACT

A semiconductor storage device includes a first chip and a second chip. The first chip includes a semiconductor substrate, transistors, a first interconnect, and first bonding electrodes. The second chip includes a memory cell array and second bonding electrodes. The second bonding electrodes are bonded to the first bonding electrodes. The first chip or the second chip has bonding pad electrodes. The second bonding electrodes include third bonding electrodes and fourth bonding electrodes. The third and fourth bonding electrodes overlap the memory cell array. The third bonding electrodes are in a current pathway between the memory cell array and the transistors whereas the fourth bonding electrodes are not in such a current pathway. The first interconnect is electrically connected to a bonding pad electrode and a fourth bonding electrode directly, without a current path via any one of transistors.

20 Claims, 15 Drawing Sheets

(56) References Cited

U.S. PATENT DOCUMENTS

| | | | | |
|---|---|---|---|---|
| 2020/0266146 A1* | 8/2020 | Nishida | ............... | H01L 23/5383 |
| 2020/0294918 A1* | 9/2020 | Nishida | ............. | H01L 21/76898 |
| 2020/0328186 A1* | 10/2020 | Liu | ........................ | H01L 24/83 |
| 2021/0035965 A1* | 2/2021 | Mizutani | ................. | H01L 25/18 |
| 2021/0091063 A1* | 3/2021 | Ninomiya | ............... | H01L 24/03 |
| 2021/0408090 A1 | 12/2021 | Kohyama | | |
| 2022/0208748 A1* | 6/2022 | Rabkin | .................. | H10B 41/27 |
| 2022/0320025 A1* | 10/2022 | Choi | ..................... | H10B 41/10 |

FOREIGN PATENT DOCUMENTS

| | | |
|---|---|---|
| TW | 202017147 A | 5/2020 |
| TW | 202030900 A | 8/2020 |

\* cited by examiner

SEMICONDUCTOR STORAGE DEVICE

CROSS-REFERENCE TO RELATED APPLICATION(S)

This application is based upon and claims the benefit of priority from Japanese Patent Application No. 2020-139279, filed Aug. 20, 2020, the entire contents of which are incorporated herein by reference.

FIELD

Embodiments described herein relate generally to a semiconductor storage device.

BACKGROUND

A semiconductor storage device of one type includes a first chip including a semiconductor substrate, transistors, and first bonding electrodes, and a second chip including a memory cell array and second bonding electrodes that are bonded to the first bonding electrodes.

DETAILED DESCRIPTION

Figure 1:
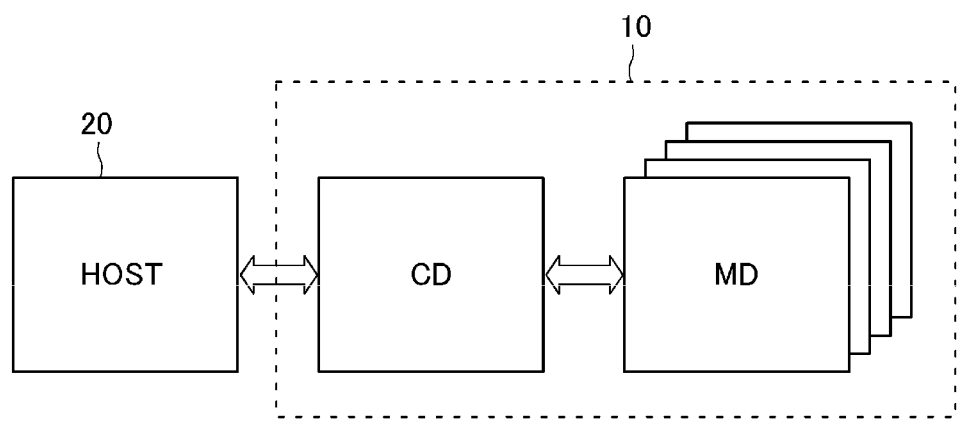
FIG. 1 is a schematic block diagram of an example configuration of a memory system 10 according to a first embodiment.

Embodiments provide a semiconductor storage device which operates at high speed.

According to one embodiment, a semiconductor storage device includes a first chip and a second chip. The first chip includes a semiconductor substrate, a plurality of transistors, a first interconnect, and a plurality of first bonding electrodes. The second chip including a memory cell array and a plurality of second bonding electrodes. The second bonding electrodes are bonded to the first bonding electrodes. At least one of the first chip and the second chip has a plurality of bonding pad electrodes connectable to bonding wires. The second bonding electrodes comprise a plurality of third bonding electrodes and a plurality of fourth bonding electrodes. Both the third and fourth bonding electrodes overlap the memory cell array when viewed in a direction intersecting a surface of the semiconductor substrate. The third bonding electrodes are in a current pathway between the memory cell array and the transistors whereas the fourth bonding electrodes are not in such a current pathway. The first interconnect is electrically connected to one of the bonding pad electrodes without via any of the transistors being in the current path, and the first interconnect is also electrically connected to at least one of the fourth bonding electrodes without via any of the transistors being in the current path.

Certain non-limiting example embodiments of the present disclosure will be described with reference to the accompanying drawings. The drawings are schematic and as such some components or elements may be omitted for convenience of illustration. In general, the same reference symbols are used throughout the drawings and description of aspects or elements previously described in conjunction with a drawing may be omitted from the discussion a description thereof is sometimes omitted.

Herein, the term "semiconductor storage device" may refer to a memory die, a memory system including a controller die, such as a memory chip, a memory card or a Solid-State Drive (SSD), and/or a host computer, such as a smartphone, a tablet computer or a personal computer, incorporating a memory system or memory die.

The phrase "a first component is electrically connected to a second component can be used to describe a case where the first component is connected directly to the second component and a case where the first component is connected to the second component via a semiconductor member or a transistor. For example, when three transistors are connected in series with each other, the first transistor can be said to be electrically connected to the third transistor even when the second transistor is in an off state.

As used herein, the phrase "a first component is connected between a second component and a third component" includes a case where the first component, the second component, and the third component are connected in series with each other, and the second component may be connected to the third component via the first component.

As used herein, the phrase "a circuit conducts electricity between two interconnects" includes a case where the circuit includes, for example, a transistor in a current pathway between the two interconnects, and the transistor turns on (is in an on state).

As used herein, the X direction refers to a direction parallel to the upper surface of a substrate, the Y direction refers to a direction parallel to the upper surface of the substrate and perpendicular to the X direction, and the Z direction refers to a direction orthogonal to the upper surface of the substrate.

As used herein, the first direction refers to a direction along a given plane, the second direction refers to another direction along the given plane intersecting with the first direction, and the third direction refers to a direction intersecting the given plane. The first direction, the second direction, and the third direction may or may not correspond to the X direction, the Y direction, and the Z direction.

As used herein, such expressions as "upper" and "lower" are based on distance from a semiconductor substrate. For example, the direction going away from the semiconductor substrate along the Z direction is referred to as "upward" or the like, while the direction approaching to the semiconductor substrate along the Z direction is referred to as "downward" or "lower". A first component farther from the semiconductor substrate than a second component may be said to be "above" the second component, and the second component may be said to be "below" the first component. The lower surface or the lower end of a component refers to the semiconductor substrate facing side or end of the component, while the upper surface or the upper end of the component refers to the opposite surface or end of the component. A surface intersecting the X direction or the Y direction can be referred to as a side surface or the like.

First Embodiment

Memory System 10

FIG. 1 is a schematic block diagram of an example configuration of a memory system 10 according to a first embodiment.

The memory system 10 performs reading, writing, erasing, etc. of user data in response to a signal transmitted from a host computer 20. The memory system 10 is, for example, a system that can memorize user data, such as a memory chip, a memory card, or an SSD. The memory system 10 includes a plurality of memory dies MD and a controller die CD. The controller die CD is connected to the memory dies MD and the host computer 20. The controller die CD includes, for example, a processor, a RAM, etc. and performs processing, such as translation between logical address and physical address, detection/correction of bit error, garbage correction (or compaction), and wear leveling.

Figure 2:
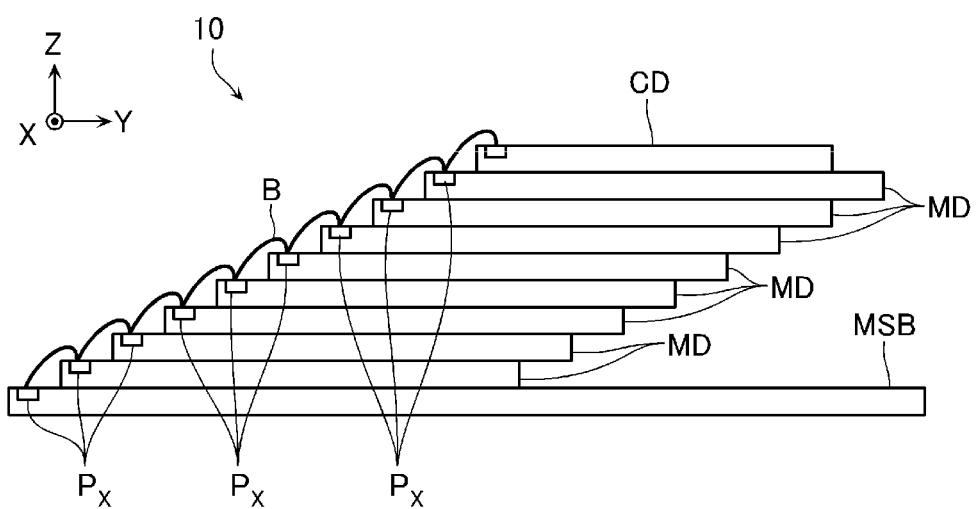
FIG. 2 depicts an example configuration of a memory system in a schematic side view according to a first embodiment.
Figure 3:
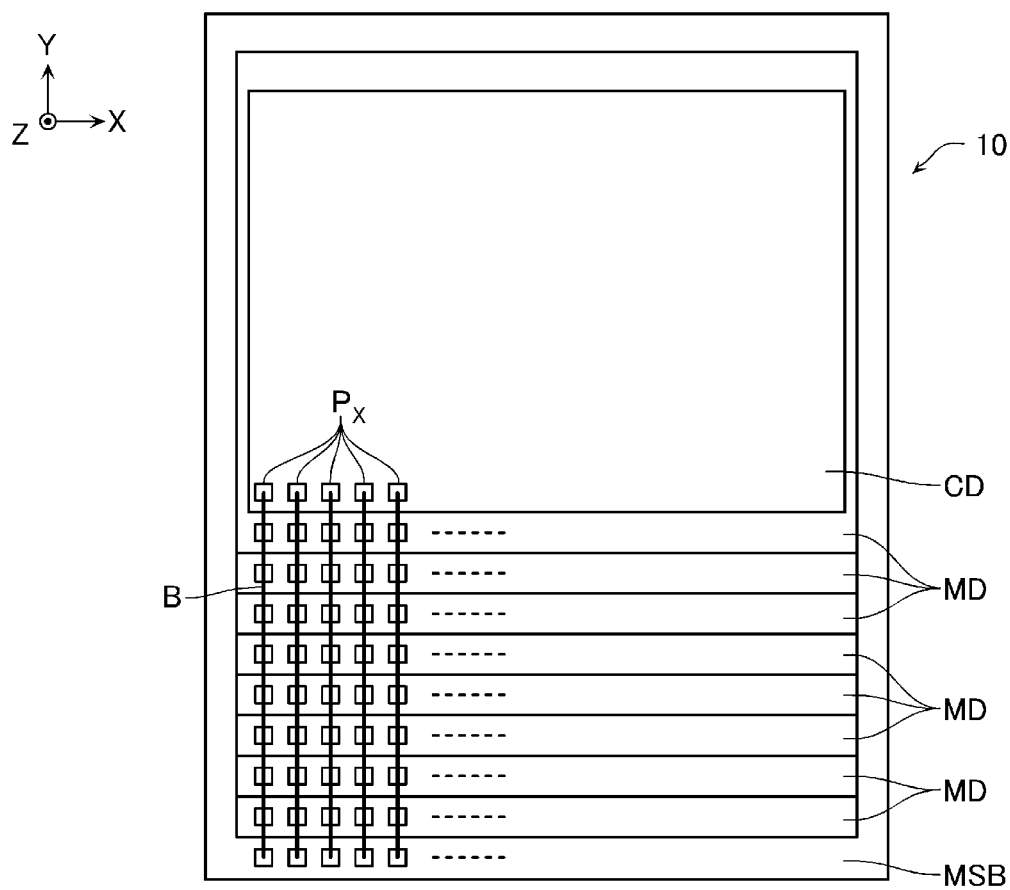
FIG. 3 depicts an example configuration of a memory system in a schematic plan view according to a first embodiment.

FIG. 2 depicts, in a schematic side view, an example configuration of the memory system 10 of the first embodiment. FIG. 3 depicts, in a schematic plan view, an example configuration of the memory system 10 of the first embodiment.

As shown in FIGS. 2 and 3, the memory system 10 of the first embodiment further includes a mounting substrate MSB, on which the memory dies MD are stacked in layers. The controller die CD is mounted on the uppermost memory die MD. Each of the mounting substrate MSB, the memory dies MD, and the controller die D has a plurality of bonding pad electrodes $P_X$. The bonding pad electrodes $P_X$ in each layer are disposed on a Y-direction end area of an exposed upper surface and aligned with each other in X-direction. For example, while a part of the upper surface of the mounting substrate MSB is bonded, for example with an adhesive, to a lower surface of the lowermost memory die MD, the bonding pad electrodes $P_X$ are provided to the Y-direction end area of the exposed upper surface of the mounting substrate MSB, that is the surface not bonded to the lowermost memory die MD. In a similar manner, while a part of the upper surface of each of the memory dies MD is bonded, for example with an adhesive, to a lower surface of another memory die MD in an upper layer, the bonding pad electrodes $P_X$ are provided to the Y-direction end area of the exposed upper surface of each layer. The uppermost memory die MD is bonded to a lower surface of the controller CD, that is the top layer of the stacking structure of the memory system 10 in the present embodiment, and the Y-direction end area of the upper surface of the controller die CD has the bonding pad electrodes $P_X$ exposed thereon.

As shown in FIG. 3, the bonding pad electrodes $P_X$ of the mounting substrate MSB, the bonding pad electrodes $P_X$ of each memory die MD, and the bonding pad electrodes $P_X$ of the controller die CD are connected to each other by bonding wires B.

The configuration shown in FIGS. 2 and 3 is one example and may be modified as appropriate or as needed. For example, in the configuration of FIGS. 2 and 3, the controller die CD in the top layer is mounted on the uppermost memory die MD, and these components are electrically connected to each other by the bonding wires B. In one instance, the memory dies MD and the controller die CD having such a configuration are incorporated in one package. In another instance, the controller die CD and the memory dies MD may be incorporated in separate packages. The memory dies MD and the controller die CD may be bonded not by the bonding wires B but by, for example, through-vias.

Configuration of Memory Die MD

Figure 4:
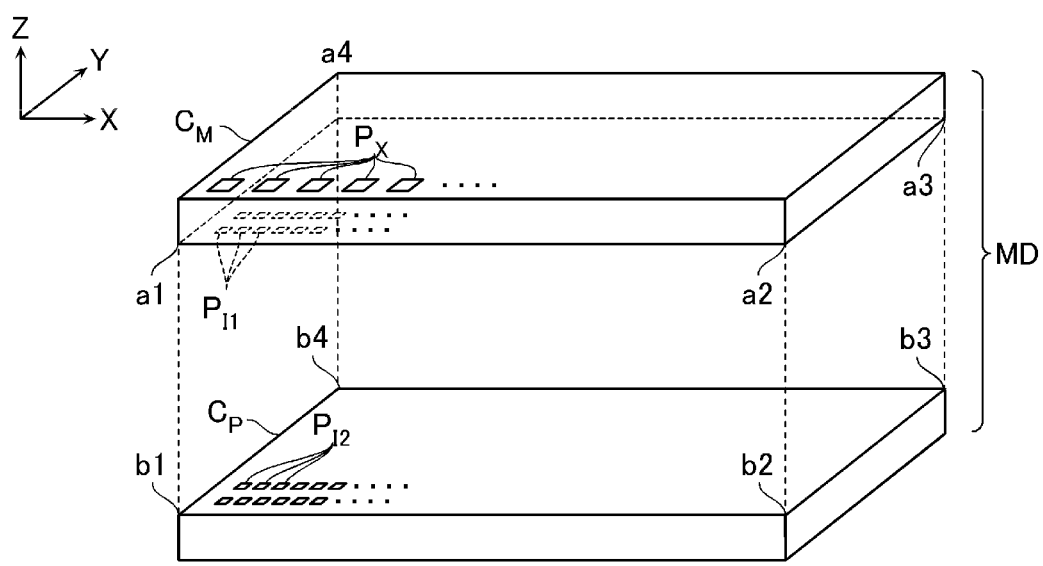
FIG. 4 depicts an example configuration of a memory die in a schematic perspective view according to a first embodiment.

FIG. 4 depicts, in a schematic exploded perspective view, an example configuration of the memory die MD of the first embodiment. As shown in FIG. 4, the memory die MD includes a chip $C_M$ having a memory cell array MCA (see, for example, FIG. 8) and a chip $C_P$ having a peripheral circuit.

The bonding pad electrodes $P_X$ are provided on an upper surface of the chip $C_M$. A plurality of bonding electrodes $P_{I1}$ are provided on a lower surface of the chip $C_M$. A plurality of bonding electrodes $P_{I2}$ are provided on an upper surface of the chip $C_P$. Herein, for the chip $C_M$, the upper surface on which the bonding electrodes $P_{I1}$ are provided may also be referred to as a front surface of the chip $C_M$, while the lower surface on which the bonding pad electrodes $P_X$ are provided may also be referred to as a back surface of the chip $C_M$. For the chip $C_P$, the upper surface on which the bonding electrodes $P_{I2}$ are provided may also be referred to as a front surface of the chip $C_P$, while a lower surface on the side opposite to the front surface may also be referred to as a back surface of the chip $C_P$. In the example of FIG. 4, the front surface of the chip $C_P$ is positioned above the back surface of the chip $C_P$, and the back surface of the chip $C_M$ is positioned above the front surface of the chip $C_M$.

The chip $C_M$ and the chip $C_P$ are disposed such that the front surface of the chip $C_M$ and the front surface of the chip $C_P$ face each other. The bonding electrodes $P_{I1}$ are provided at positions corresponding to the bonding electrodes $P_{I2}$ so that they can be bonded to the bonding electrodes $P_{I2}$. The bonding electrodes $P_{I1}$ and the bonding electrodes $P_{I2}$ function as bonding electrodes for bonding and electrically connecting the chip $C_M$ and the chip $C_P$ together. The bonding pad electrodes $P_X$ function as the pad electrodes (see FIGS. 2 and 3).

The corners a1, a2, a3, and a4 of the chip $C_M$ correspond to the corners b1, b2, b3, and b4 of the chip $C_P$, respectively.

Figure 5:
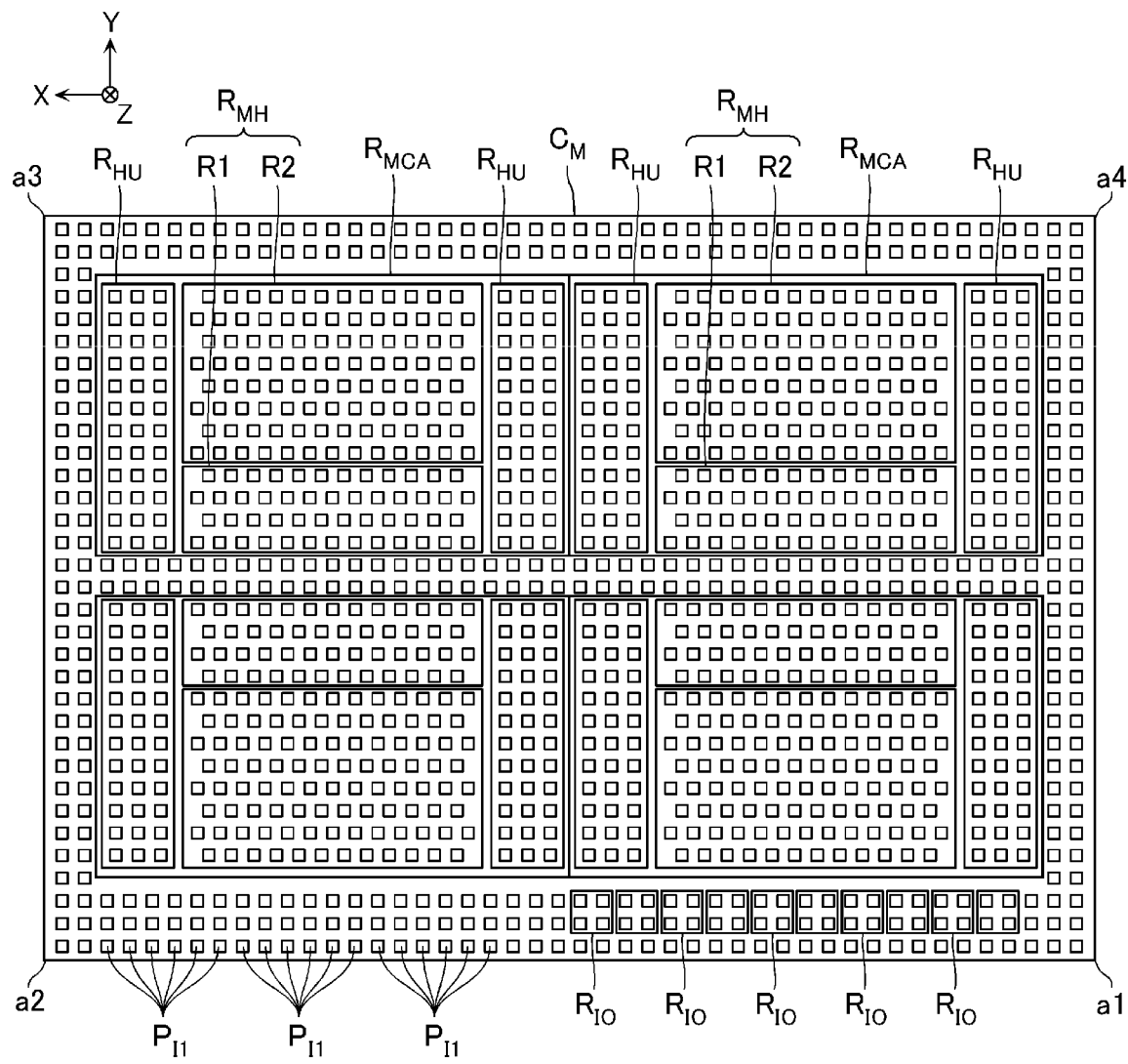
FIG. 5 depicts an example configuration of a chip in a memory die in a schematic bottom view according to a first embodiment.
Figure 6:
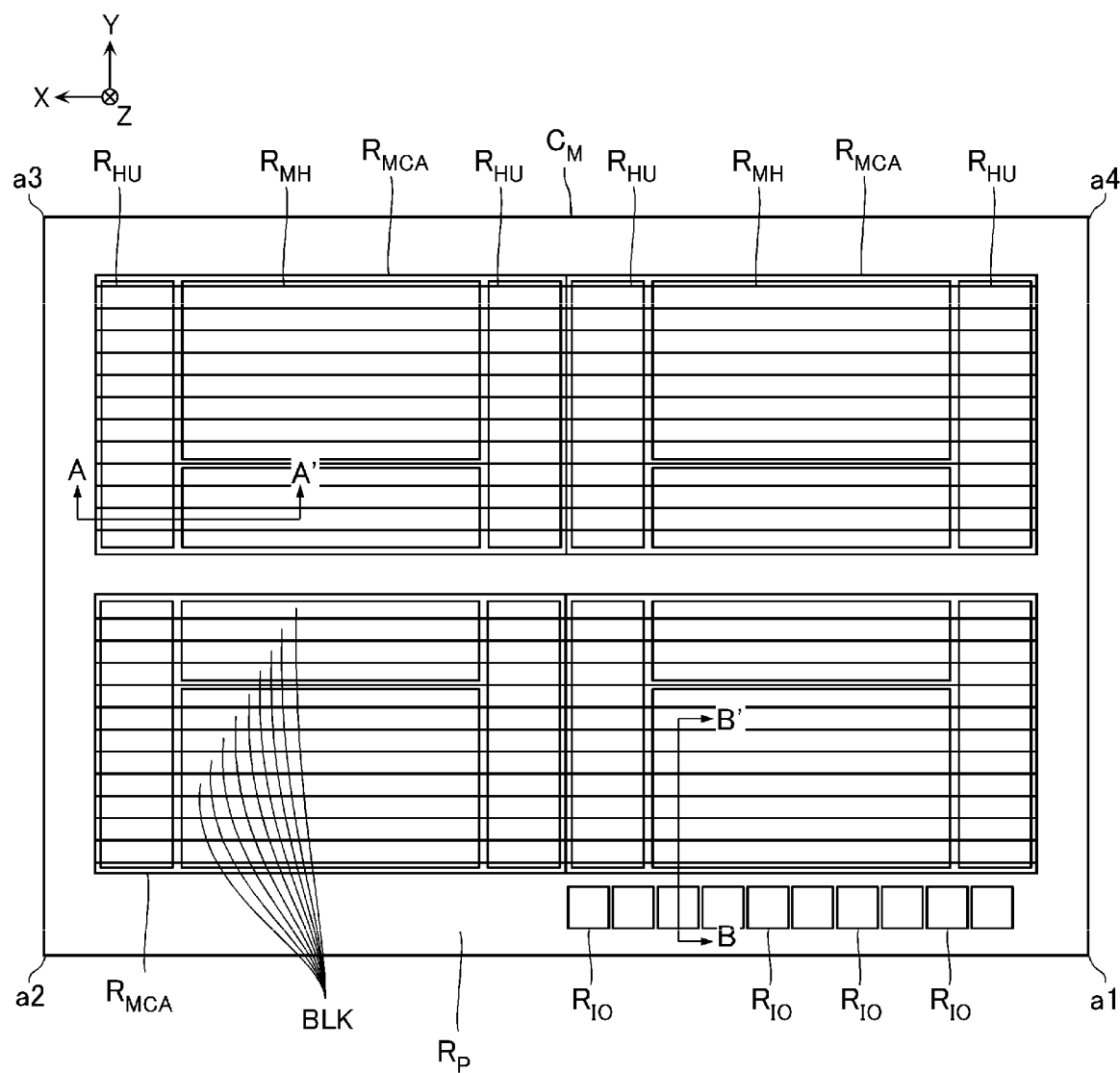
FIG. 6 depicts an example configuration of a chip in a memory die in a schematic bottom view according to a first embodiment.
Figure 7:
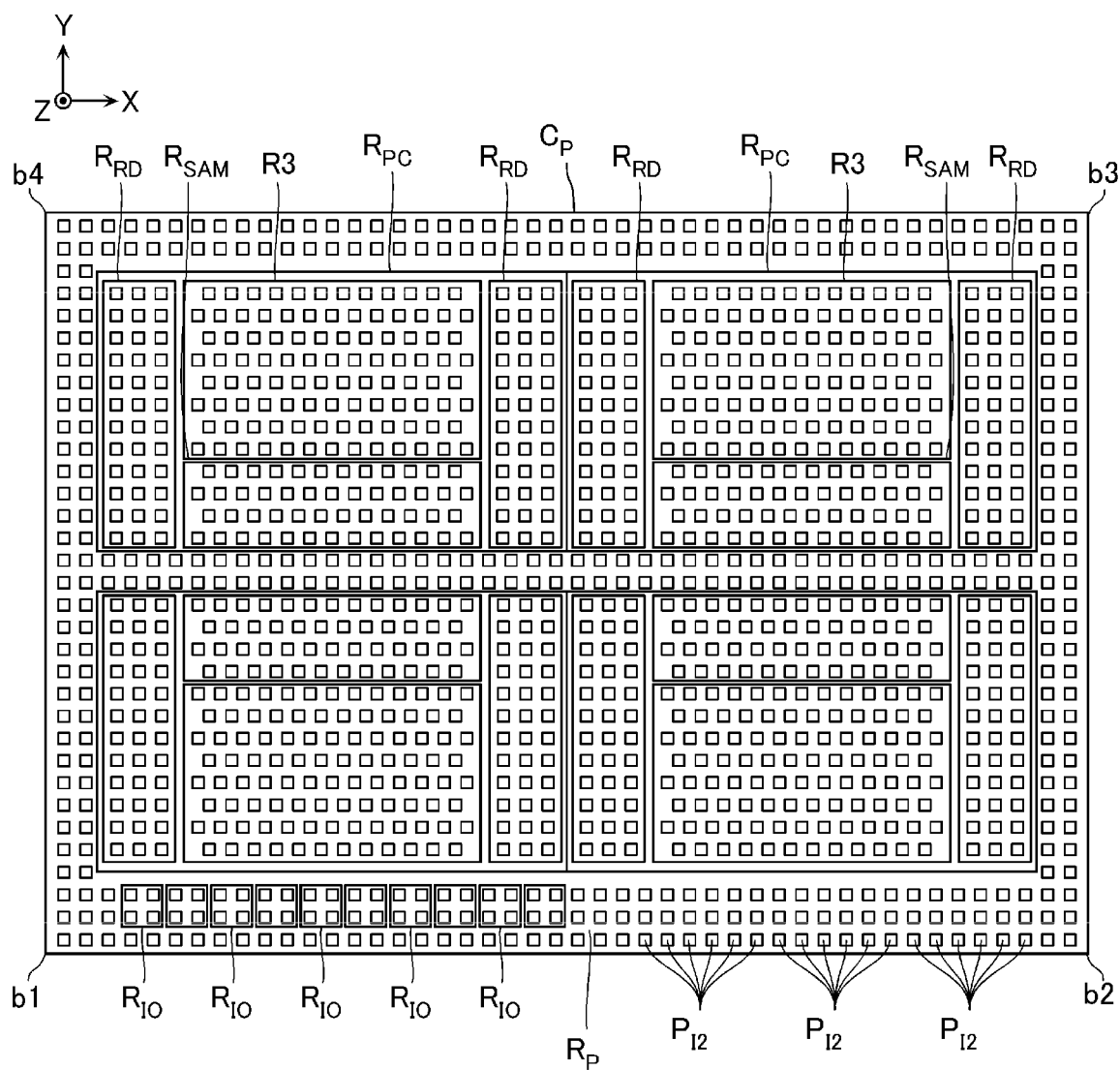
FIG. 7 depicts an example configuration of a chip in a memory die in a schematic plan view according to a first embodiment.
Figure 8:
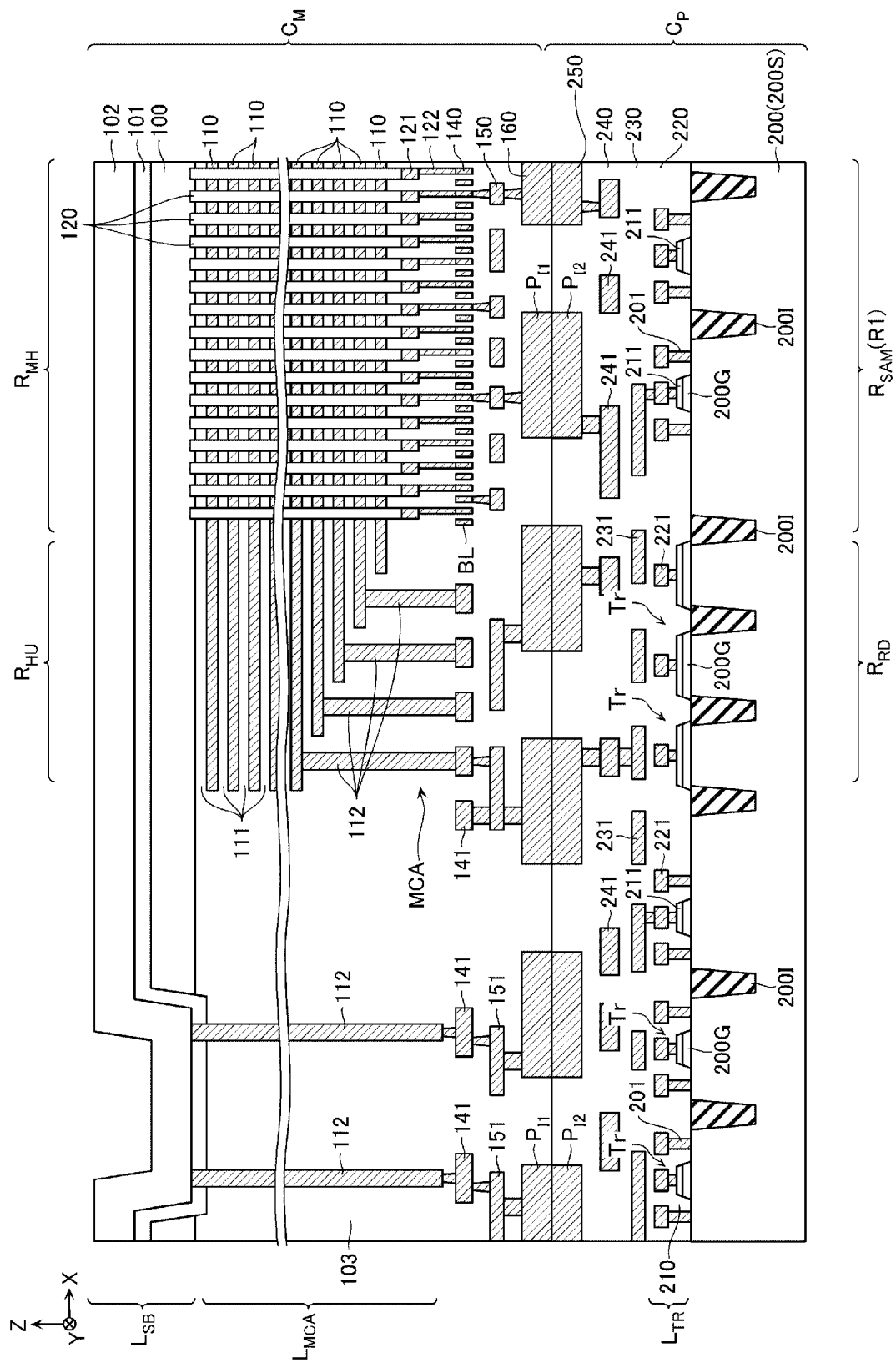
FIG. 8 depicts an example configuration of a memory die corresponding to line A-A' of FIG. 6 in a schematic cross-sectional view according to a first embodiment.
Figure 9:
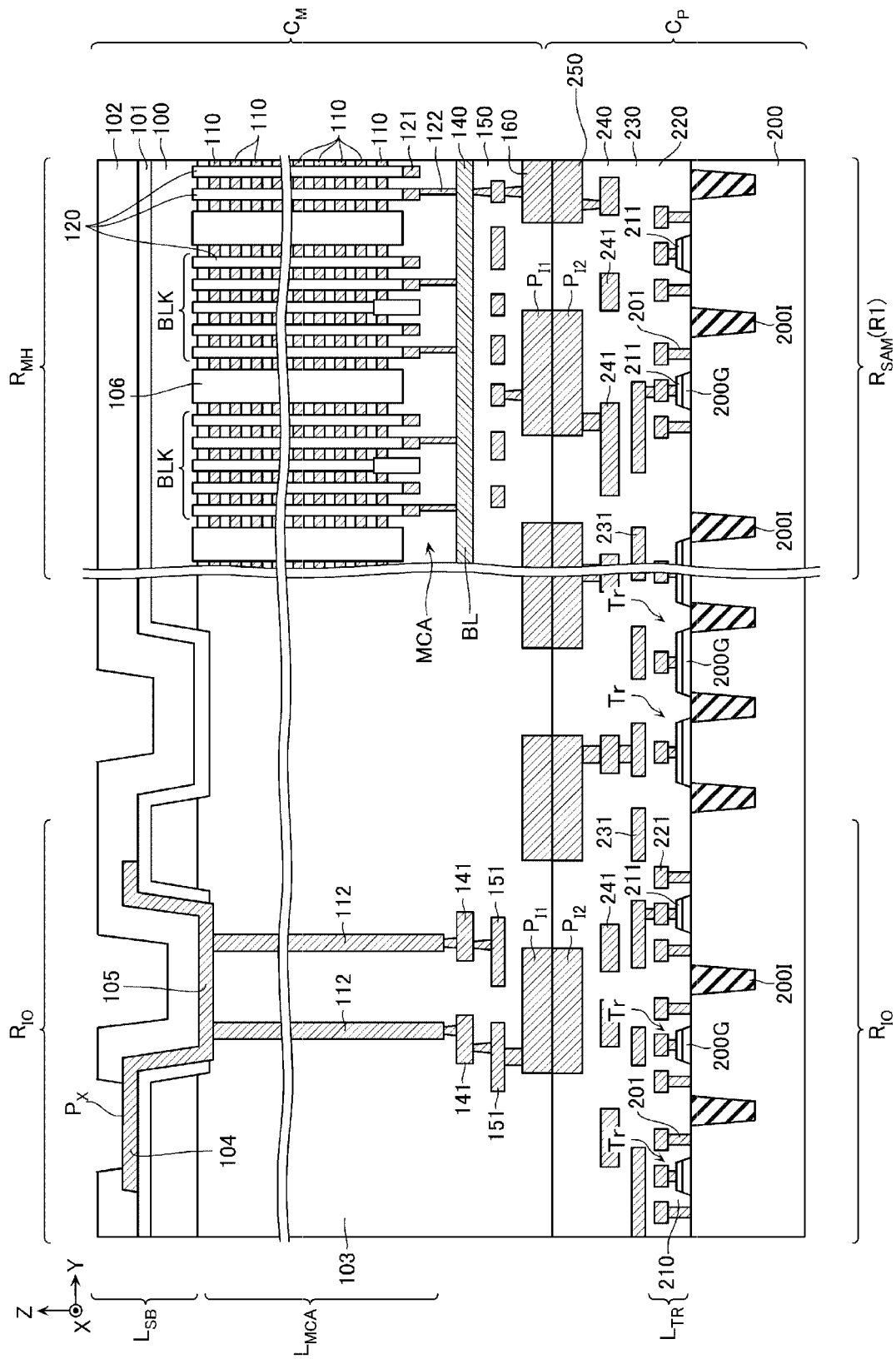
FIG. 9 depicts an example configuration of a memory die corresponding to line B-B' of FIG. 6 in a schematic cross-sectional view according to a first embodiment.
Figure 10:
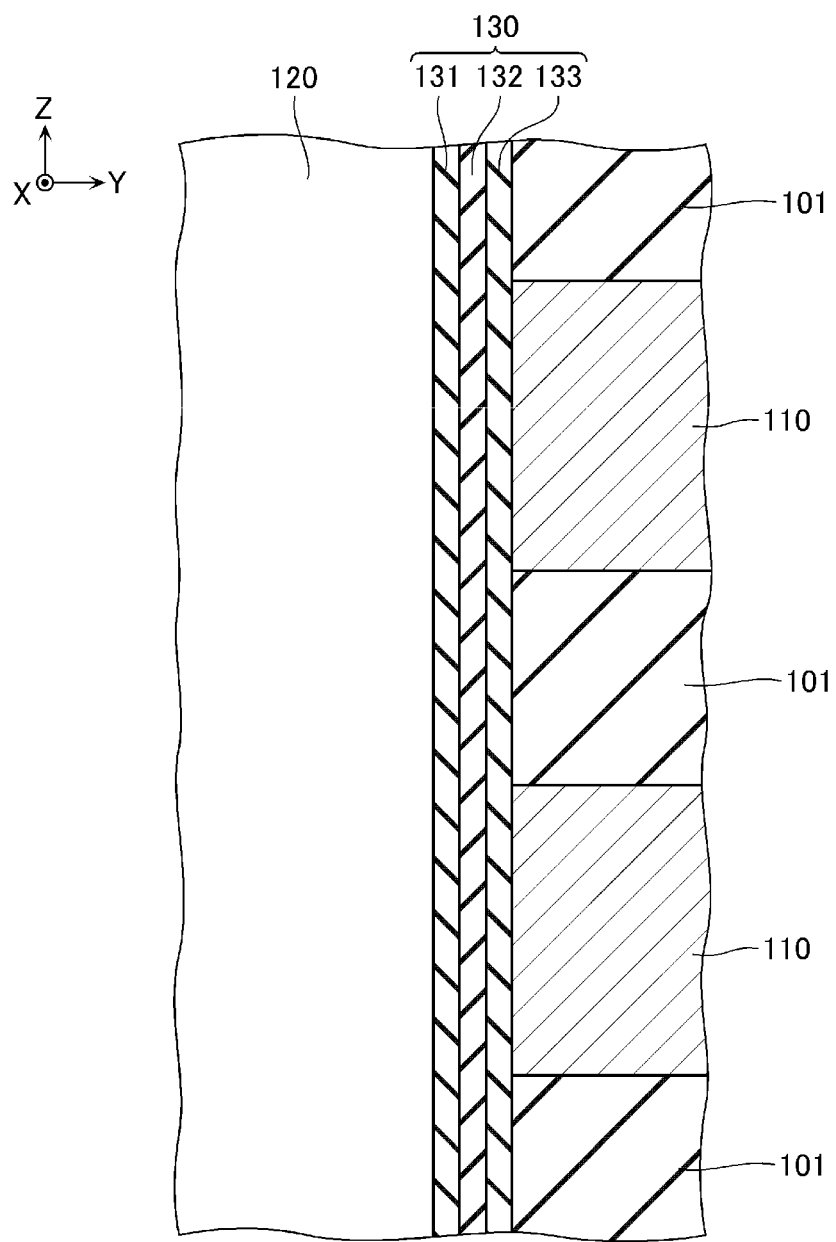
FIG. 10 depicts an example configuration of a memory die in a schematic enlarged view according to a first embodiment.

FIG. 5 depicts, in a schematic bottom view, an example configuration of the chip $C_M$. FIG. 6 depicts, in a schematic bottom view, an example configuration of an inside of the chip $C_M$ viewed from the chip surface on which the bonding electrodes $P_{I1}$ are provided. FIG. 7 depicts, in a schematic plan view, an example configuration of the chip $C_P$. FIG. 8 depicts, in a schematic cross-sectional view, an example configuration of the memory die MD corresponding to the line A-A' of FIG. 6. FIG. 9 depicts, in a schematic cross-sectional view, an example configuration of the memory die MD corresponding to the line B-B' of FIG. 6. FIG. 10 depicts, in a schematic enlarged view, an example configuration of a portion of the memory die of FIG. 9.

Structure of Chip $C_M$

As shown in FIG. 6, the chip $C_M$ has four memory cell array regions $R_{MCA}$ arranged in the X and Y directions. Each memory cell array region $R_{MCA}$ includes a memory hole region $R_{MH}$, in which memory cells are provided, and hookup regions $R_{HU}$ provided on both sides (for example, left and right sides in FIG. 6) of the memory hole region $R_{MH}$ in the X direction. The chip $C_M$ also has a peripheral region $R_P$ outside the four memory cell array regions $R_{MCA}$. The peripheral region $R_P$ includes a region between the two memory cell array regions $R_{MCA}$ in the Y direction, regions between the memory cell array regions $R_{MCA}$ and the Y-direction ends of the chip $C_M$, and regions between the memory cell array regions $R_{MCA}$ and the X-direction ends of the chip $C_M$. Input/output circuit regions $R_{IO}$ are provided in the peripheral region $R_P$ at positions corresponding to the bonding pad electrodes $P_X$ that are provided as shown in FIGS. 2, 3 and 4.

While the hookup regions RHO are provided on both sides in the X direction of each memory hole region $R_{MH}$ in the present embodiment, this configuration is one example and may be modified as appropriate or as needed. For example, the hookup region (or regions) $R_{HU}$ may be provided at or near the center in the X direction of each memory cell array region $R_{MCA}$.

As shown in FIGS. 8 and 9, the chip $C_M$ includes a substrate layer $L_{SB}$, a memory cell array layer $L_{MCA}$ provided below the substrate layer $L_{SB}$, and interconnect layers 140, 150, and 160 provided below the memory cell array layer $L_{MCA}$.

Structure of the Substrate Layer $L_{SB}$ of Chip $C_M$

As shown in FIG. 8, the substrate layer $L_{SB}$ includes a semiconductor layer 100, an insulating layer 101 provided on an upper surface of the semiconductor layer 100, and an insulating layer 102 provided on an upper surface of the insulating layer 101. As shown in FIG. 9, the bonding pad electrodes $P_X$ are disposed between the insulating layer 101 and the insulating layer 102 and provided in the input/output circuit regions $R_{IO}$.

The semiconductor layer 100 is formed of, for example, silicon (Si) doped with an N-type impurity such as phosphorus (P) or a P-type impurity such as boron (B). A layer of a metal such as tungsten (W) or a silicide such as tungsten silicide (WSi) may be provided between the semiconductor layer 100 and the insulating layer 101. The semiconductor layer 100 is provided in a plurality of regions which are separated from each other in the X and Y directions. For example, the semiconductor layer 100 is provided in four regions corresponding to the four memory cell array regions $R_{MCA}$ that are shown in FIG. 6.

The insulating layer 101 is formed of, for example, an insulating material such as silicon oxide ($SiO_2$). As shown in FIGS. 8 and 9, the insulating layer 101 entirely covers the upper surface and side surfaces of the semiconductor layer 100 and also an upper surface of an insulating layer 103 contained in the memory cell array layer $L_{MCA}$. The insulating layer 103 is formed of, for example, silicon oxide ($SiO_2$).

The insulating layer 102 may be a passivation layer formed of an insulating material such as polyimide.

The bonding pad electrodes $P_X$ comprise a conductive material such as aluminum (Al). As shown in FIG. 9, the bonding pad electrodes $P_X$ each include an external connection region 104 and an internal connection region 105. The external connection region 104 is provided on the upper surface of the semiconductor layer 100 via the insulating layer 101. The internal connection region 105 is provided on the upper surface of the insulating layer 103 contained in the memory cell array layer $L_{MCA}$.

The external connection region 104 is connected to the bonding wires B that are arranged as shown in FIGS. 2 and 3. An opening is provided at least in part of an area of the insulating layer 102 which corresponds to the external connection region 104. The external connection region 104 is exposed from the opening to the outside of the memory die MD.

The internal connection region 105 is connected to contacts 112 contained in the memory cell array layer $L_{MCA}$. The internal connection region 105 is provided below the external connection region 104.

Structure of the Memory Cell Array Layer $L_{MCA}$ of Chip $C_M$

As shown in FIG. 9, the memory cell array MCA is provided in each memory cell array region $R_{MCA}$ in the memory cell array layer $L_{MCA}$. The memory cell array MCA includes a plurality of memory blocks BLK and a plurality of inter-block insulating layers 106. The memory blocks BLK are arranged in the Y direction. Each of the inter-block insulating layers 106 is formed of, for example, silicon oxide ($SiO_2$) and provided between the memory blocks BLK.

Each memory block BLK contained in the memory hole region $R_{MH}$ includes a plurality of conductive layers 110 arranged in the Z direction, a plurality of semiconductor layers 120 extending in the Z direction, and a plurality of gate insulating films 130 provided between the conductive layers 110 and the semiconductor layers 120. The gate insulating films 130 are separately and partially shown in FIG. 10.

As shown in FIG. 8, the conductive layers 110 each have a plate-like or substantially plate-like shape extending in the X direction. Each conductive layer 110 may comprise, for example, a stacked film consisting of a barrier conductive film and a metal film. The barrier conductive film is formed of, for example, titanium nitride (TiN). The metal film is, for example, formed of tungsten (W). Alternatively, each conductive layer 110 may comprise, for example, polycrystalline silicon containing an impurity such as phosphorus (P) or boron (B). Insulating films 111 formed of, for example, silicon oxide ($SiO_2$) are provided between the conductive layers 110 arranged in the Z direction. The conductive layers 110 function, for example, as gate electrodes of word lines and memory cells connected to the word lines.

The semiconductor layers 120 function, for example, as channel regions of memory cells. The semiconductor layers 120 are formed of, for example, polycrystalline silicon (Si). Each semiconductor layer 120 has, for example, a cylindrical or substantially cylindrical shape. A peripheral surface of each semiconductor layer 120 is covered with and faces the conductive layers 110.

Each semiconductor layer 120, at a lower end thereof, has an impurity region (not separately depicted) containing an N-type impurity such as phosphorus (P). The impurity region is connected to a bit line BL via a contact 121 and a contact 122.

Each semiconductor layer 120, at an upper end thereof, has an impurity region (not separately depicted) containing an N-type impurity such as phosphorus (P) or a P-type impurity such as boron (B). The impurity region is connected to the semiconductor layer 100.

The gate insulating films 130 each have a cylindrical or substantially cylindrical shape that covers the peripheral surface of the semiconductor layer 120. As shown in FIG. 10, each gate insulating film 130 includes a tunnel insulating film 131, a charge storage film 132, and a block insulating film 133, which are stacked between the semiconductor layer 120 and the conductive layers 110. Each of the tunnel insulating film 131 and the block insulating film 133 is, for example, formed of silicon oxide ($SiO_2$). The charge storage film 132 is, for example, formed of silicon nitride ($Si_3N_4$) and is capable of storing charges. The tunnel insulating film 131, the charge storage film 132, and the block insulating film 133 each have a cylindrical or substantially cylindrical shape and extend in the Z direction along the peripheral surface of the semiconductor layer 120.

The gate insulating film 130 may include, instead of the charge storage film 132, a floating gate formed of, for example, polycrystalline silicon containing an N-type or P-type impurity.

As shown in FIG. 8, each memory block BLK has the X-direction ends of its conductive layers 110 arranged in the hookup region $R_{HU}$ along the Z direction and the contacts 112 extending in the Z direction.

The conductive layers 110 have ends arranged in a stair-like or substantially stair-like structure in the hookup region $R_{HU}$. Thus, the X-direction end of a lower one of the conductive layers 110 is positioned nearer to the memory hole region $R_{MH}$, and the X-direction end of an upper one of the conductive layers 110 is positioned farther from the memory hole region $R_{MH}$.

Each contact 112 comprises, for example, a stacked film consisting of a barrier conductive film and a metal film. The barrier conductive film is formed of, for example, titanium nitride (TiN). The metal film is formed of, for example, tungsten (W). Each contact 112 has, for example, a cylindrical or substantially cylindrical shape. The contacts 112, at upper ends thereof, are connected to different conductive layers 110 and, at lower ends thereof, are connected to different interconnects 141.

As shown in FIG. 9, the input/output circuit regions $R_{IO}$ of the memory cell array layer $L_{MCA}$ each include the plurality of contacts 112 extending in the Z direction. The contacts 112 are connected to, at upper ends thereof, a lower surface of the internal connection region 105 of the bonding pad electrode $P_X$ and are, at lower ends thereof, connected to the respective interconnects 141.

Structures of the Interconnect Layers 140, 150, 160 of Chip $C_M$

The interconnects in the interconnect layers 140, 150, and 160 are, in one instance, electrically connected to at least one of components or structures in the memory cell array layer $L_{MCA}$ or at least one of components or structures in the chip $C_P$. In another instance, the interconnects are electrically connected to both the components or structures in the memory cell array layer $L_{MCA}$ and the components or structures in the chip $C_P$.

The interconnect layer 140 includes a plurality of interconnects 141. The interconnects 141 may each comprise, for example, a stacked film consisting of a barrier conductive film and a metal film. The barrier conductive film is formed of, for example, titanium nitride (TiN). The metal film is formed of, for example, copper (Cu). Some of the interconnects 141 function as bit lines BL. As an example, the bit lines BL are arranged in the X direction as shown in FIG. 8 and extend in the Y direction as shown in FIG. 9. The bit lines BL are connected to the semiconductor layers 120.

The interconnect layer 150 includes a plurality of interconnects 151. The interconnects 151 may each comprise, for example, a stacked film consisting of a barrier conductive film and a metal film. The barrier conductive film is formed of, for example, titanium nitride (TiN). The metal film is formed of, for example, copper (Cu).

The interconnect layer 160 includes a plurality or a set of bonding electrodes $P_{I1}$. The bonding electrodes $P_{I1}$ of the interconnect layer 160 may each comprise, for example, a stacked film consisting of a barrier conductive film and a metal film. The barrier conductive film is formed of, for example, titanium nitride (TiN). The metal film is formed of, for example, copper (Cu).

As shown in FIG. 5, another set of bonding electrodes $P_{I1}$ are provided in each hookup region $R_{HU}$. The bonding electrodes $P_{I1}$ of the hookup region $R_{HU}$ are electrically connected to the conductive layers 110 via the contacts 112 (see FIG. 8).

As shown in FIG. 5, each memory hole region $R_{MH}$ includes a region R1 and a region R2. The region R1 overlaps a sense amplifier module region $R_{SAM}$ (see FIG. 7) when viewed in the Z direction. The region R2 does not overlap the sense amplifier module region $R_{SAM}$ (see FIG. 7) when viewed in the Z direction.

As shown in FIG. 5, still another set of bonding electrodes $P_{I1}$ are provided in the region R1. The bonding electrodes $P_{I1}$ of the region R1 are electrically connected to the bit lines BL (see FIG. 8).

As shown in FIG. 5, a further set of bonding electrodes $P_{I1}$ are provided in the region R2.

As shown in FIG. 5, a still further set of bonding electrodes $P_{I1}$ are provided in each input/output circuit region $R_{IO}$. The bonding electrodes $P_{I1}$ of the input/output circuit region $R_{IO}$ are electrically connected to the bonding pad electrode $P_X$ via the contacts 112 (see FIG. 9).

As shown in FIG. 5, another set of bonding electrodes $P_{I1}$ are provided in an area of the peripheral region $R_P$ lying outside the input/output circuit regions $R_{IO}$.

Structure of Chip $C_P$

As shown in FIG. 7, the chip $C_P$ has four circuit regions $R_{PC}$ provided at positions corresponding to the four memory cell array regions $R_{MCA}$ (that are arranged as shown in FIG. 6). Each circuit region $R_{PC}$ includes a sense amplifier module region $R_{SAM}$ provided at a position corresponding to part of the memory hole region $R_{MH}$ (FIG. 6), and two row decoder regions $R_{RD}$ provided at positions corresponding to the two hookup regions $R_{HU}$ (FIG. 6). The chip $C_P$ also has its own peripheral region and input/output circuit regions $R_{IO}$. The peripheral region $R_P$ of the chip $C_P$ is provided at a position corresponding to the peripheral region $R_P$ of the chip $C_M$. The input/output circuit regions $R_{IO}$ of the chip $C_P$ are provided at positions corresponding to the input/output circuit regions $R_{IO}$ of the chip $C_M$.

As shown in FIGS. 8 and 9, the chip $C_P$ includes a semiconductor substrate 200, a transistor layer $L_{TR}$ provided above the semiconductor substrate 200, and interconnect layers 220, 230, 240, and 250 provided above the transistor layer $L_{TR}$.

Structure of the Semiconductor Substrate 200 of Chip $C_P$

The semiconductor substrate 200 is formed of, for example, P-type silicon (Si) containing a P-type impurity such as boron (B). A semiconductor substrate region 200S and an insulating region 200I are provided in a surface of the semiconductor substrate 200.

Structure of the Transistor Layer $L_{TR}$ of Chip $C_P$

In the transistor layer $L_{TR}$, an electrode layer 210 is provided on an upper surface of the semiconductor substrate 200 via an insulating layer 200G. The electrode layer 210 includes a plurality of electrodes 211 that face the surface of the semiconductor substrate 200. The electrodes 211 of the electrode layer 210 and respective regions of the semiconductor substrate 200 are connected to contacts 201.

The semiconductor substrate region 200S of the semiconductor substrate 200 functions as, for example, a channel region of transistors Tr constituting a peripheral circuit.

The electrodes 211 of the electrode layer 210 function as, for example, gate electrodes of the transistors Tr constituting the peripheral circuit. Each electrode 211 comprises, for example, a semiconductor layer and a metal layer provided on an upper surface of the semiconductor layer. The semiconductor layer is formed of, for example, polycrystalline silicon (Si) containing an N-type impurity such as phosphorus (P) or a P-type impurity such as boron (B). The metal layer is formed of, for example, tungsten (W).

The contacts 201 extend in the Z direction and, at their lower ends, are connected to the upper surface of the semiconductor substrate 200 or the upper surfaces of the electrodes 211. Each contact 201 may comprise, for example, a stacked film consisting of a barrier conductive film and a metal film. The barrier conductive film is formed of, for example, titanium nitride (TiN). The metal film is formed of, for example, tungsten (W).

The transistors Tr provided on the semiconductor substrate 200 each constitute part of the peripheral circuit.

For example, the transistors Tr provided in the row decoder regions $R_{RD}$ (see FIG. 7) constitute part of a row decoder which transfers a voltage selectively to one of the conductive layers 110. Some of the transistors Tr constituting the row decoder function as word-line switches which are connected to the conductive layers 110 without using any other transistors Tr.

The transistors Tr provided in the sense amplifier module regions $R_{SAM}$ (see FIG. 7) constitute part of a sense amplifier module which measures a voltage or electric current of the bit lines BL and transfers a voltage selectively to one of the bit lines BL. Some of the transistors Tr constituting the sense amplifier module function as bit-line switches which are connected to the bit lines BL without using any other transistors Tr.

The transistors Tr provided in the input/output circuit regions $R_{IO}$ (see FIG. 7) function as an input/output circuit which performs input/output of user data, command data or address data via some of the bonding pad electrodes $P_X$. Some of the transistors Tr constituting the input/output circuit function as part of a pull-up circuit, part of a pull-down circuit, or part of a comparator which is connected to the bonding pad electrodes $P_X$ without using any other transistors Tr.

Structures of the Interconnect Layers 220, 230, 240, and 250 of Chip $C_P$

The interconnects in the interconnect layers 220, 230, 240, and 250 are, in one instance, electrically connected to at least one of components or structures in the transistor layer $L_{TR}$ or at least one of components or structures in the chip $C_M$. In another instance, the interconnects are electrically connected to both the components or structures in the memory cell array layer $L_{TR}$ and the components or structures in the chip $C_M$.

The interconnect layer 220 includes a plurality of interconnects 221. The interconnects 221 may each comprise, for example, a stacked film consisting of a barrier conductive film and a metal film. The barrier conductive film is formed of, for example, titanium nitride (TiN). The metal film is formed of, for example, copper (Cu).

The interconnect layer 230 includes a plurality of interconnects 231. The interconnects 231 may each comprise, for example, a stacked film consisting of a barrier conductive film and a metal film. The barrier conductive film is formed of, for example, titanium nitride (TiN). The metal film is formed of, for example, copper (Cu).

The interconnect layer 240 includes a plurality of interconnects 241. The interconnects 241 may each comprise, for example, a stacked film consisting of a barrier conductive film and a metal film. The barrier conductive film is formed of, for example, titanium nitride (TiN). The metal film is formed of, for example, copper (Cu).

The interconnect layer 250 includes a plurality or a set of bonding electrodes $P_{I2}$. The bonding electrodes $P_{I2}$ of the interconnect layer 250 may each comprise, for example, a stacked film consisting of a barrier conductive film and a metal film. The barrier conductive film is formed of, for example, titanium nitride (TiN). The metal film is formed of, for example, copper (Cu).

As shown in FIG. 7, another set of bonding electrodes $P_{I2}$ are provided in each row decoder region $R_{RD}$. The bonding electrodes $P_{I2}$ of the row decoder regions $R_{RD}$ are electrically connected to the transistors Tr, which constitute the row decoder, via the contacts 201 provided in the transistor layer $L_{TR}$ as shown in FIG. 9. Further, the bonding electrodes $P_{I2}$ of the row decoder regions $R_{RD}$ are electrically connected to the conductive layers 110 via the bonding electrodes $P_{I1}$.

As shown in FIG. 7, still another set of bonding electrodes $P_{I2}$ are provided in each sense amplifier module region $R_{SAM}$. The bonding electrodes $P_{I2}$ of the sense amplifier module regions $R_{SAM}$ are electrically connected to the transistors Tr, which constitute the sense amplifier module, via the contacts 201 provided in the transistor layer $L_{TR}$ as shown in FIG. 9. Further, the bonding electrodes $P_{I2}$ of the sense amplifier module regions $R_{SAM}$ are electrically connected to the bit lines BL via the bonding electrodes $P_{I1}$.

As shown in FIG. 7, a further set of bonding electrodes $P_{I2}$ are provided in a region R3 which is located in each circuit region $R_{PC}$ and which overlaps the region R2 arranged as shown in FIG. 5, when viewed in the Z direction.

As shown in FIG. 7, a still further set of bonding electrodes $P_{I2}$ are provided in each input/output circuit region $R_{IO}$. The bonding electrodes $P_{I2}$ of the input/output circuit regions $R_{IO}$ are electrically connected to the transistors Tr, which constitute the input/output circuit, via the contacts 201 arranged as shown in FIG. 9. The bonding electrodes $P_{I2}$ of the input/output circuit regions $R_{IO}$ are also electrically connected to the bonding pad electrodes $P_X$ via the bonding electrodes $P_{f1}$.

As shown in FIG. 7, another set of bonding electrodes $P_{f2}$ are provided in an area of the peripheral region $R_P$ lying outside the input/output circuit regions $R_{IO}$.

Heat Dissipation Structure of Memory Die MD

When a read operation, a write operation, an erasing operation, or the like is performed on the memory die MD, the transistors Tr in the chip $C_P$ generate heat. Temperatures of the respective transistors Tr may be monitored and controlled to be at a predetermined temperature or lower. When the temperatures reach a predetermined threshold value, an operation speed of the memory die MD may have to be reduced.

Generally, it is difficult for a memory die MD to operate at a high speed for a long time due to rising temperatures resulting from prolonged high-speed operations.

Figure 11:
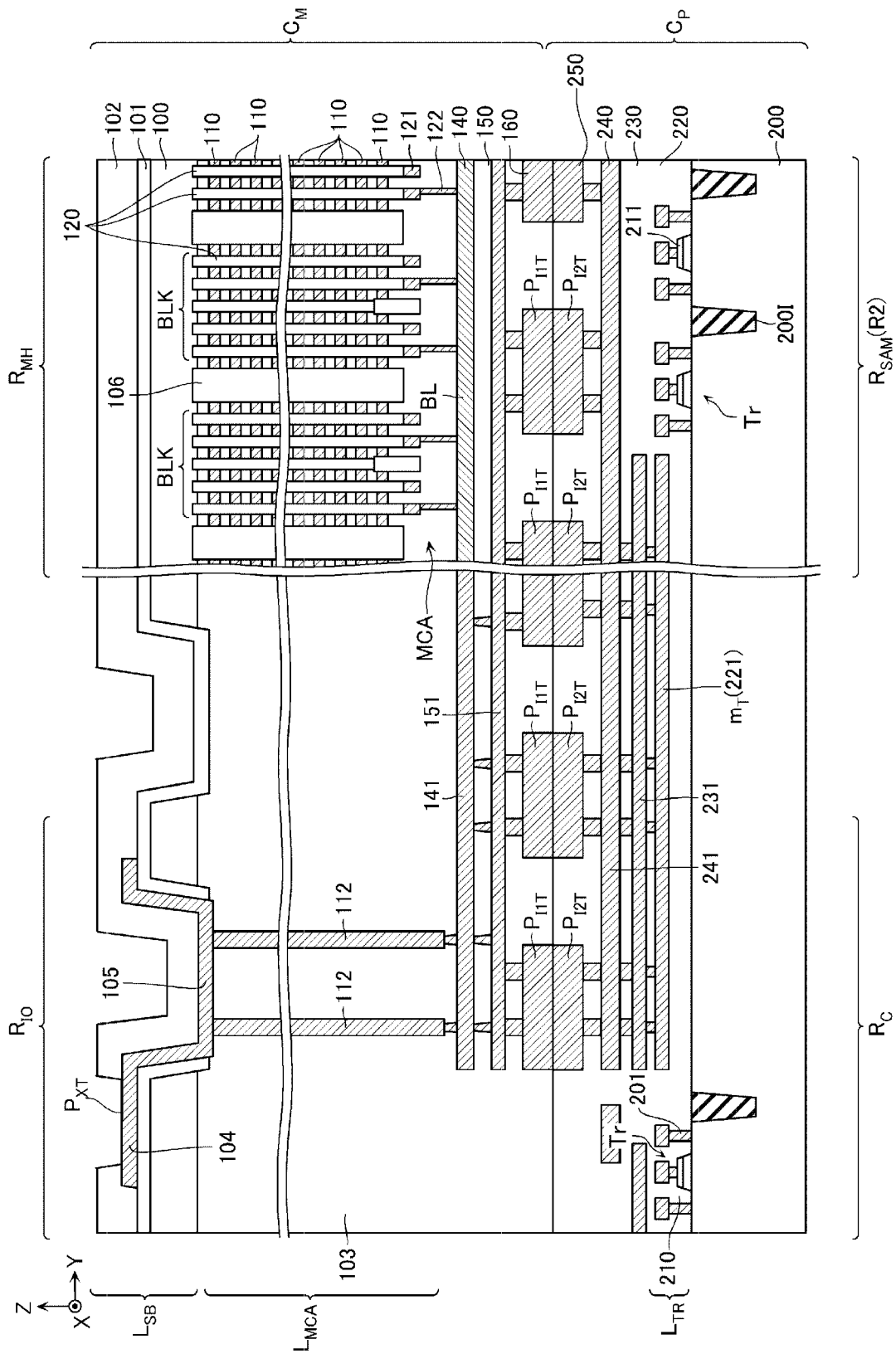
FIG. 11 depicts an example configuration of a memory die in a schematic cross-sectional view according to a first embodiment.

The memory die MD of the present embodiment has a heat dissipation structure for efficiently dissipating the heat of the transistors Tr outside the memory die MD. As shown in FIG. 11, the heat dissipation structure includes an interconnect $m_T$ provided in the vicinity of the transistors Tr, a bonding pad electrode $P_{XT}$ electrically connected to the interconnect $m_T$ without using any transistors Tr in the memory die MD, and bonding electrodes $P_{f1T}$ and $P_{f2T}$ electrically connected to the interconnect $m_T$ without using any transistors Tr in the memory die MD.

The heat dissipation structure enables the heat generated by the transistors Tr to be absorbed by the nearby interconnect $m_T$ and dissipated outside the memory system 10 via the bonding pad electrode $P_{XT}$ and further through the bonding wires B (see FIGS. 2 and 3).

The bonding electrodes $P_{f1T}$, $P_{f2T}$ may comprise a material having a relatively excellent heat absorbing properties, such as copper (Cu), and have a relatively large volume. With such bonding electrodes, the heat dissipation structure can further efficiently absorb the heat generated by the transistors Tr.

Interconnect $m_T$

The interconnect $m_T$ may be one of the interconnects 221.

Figure 12:
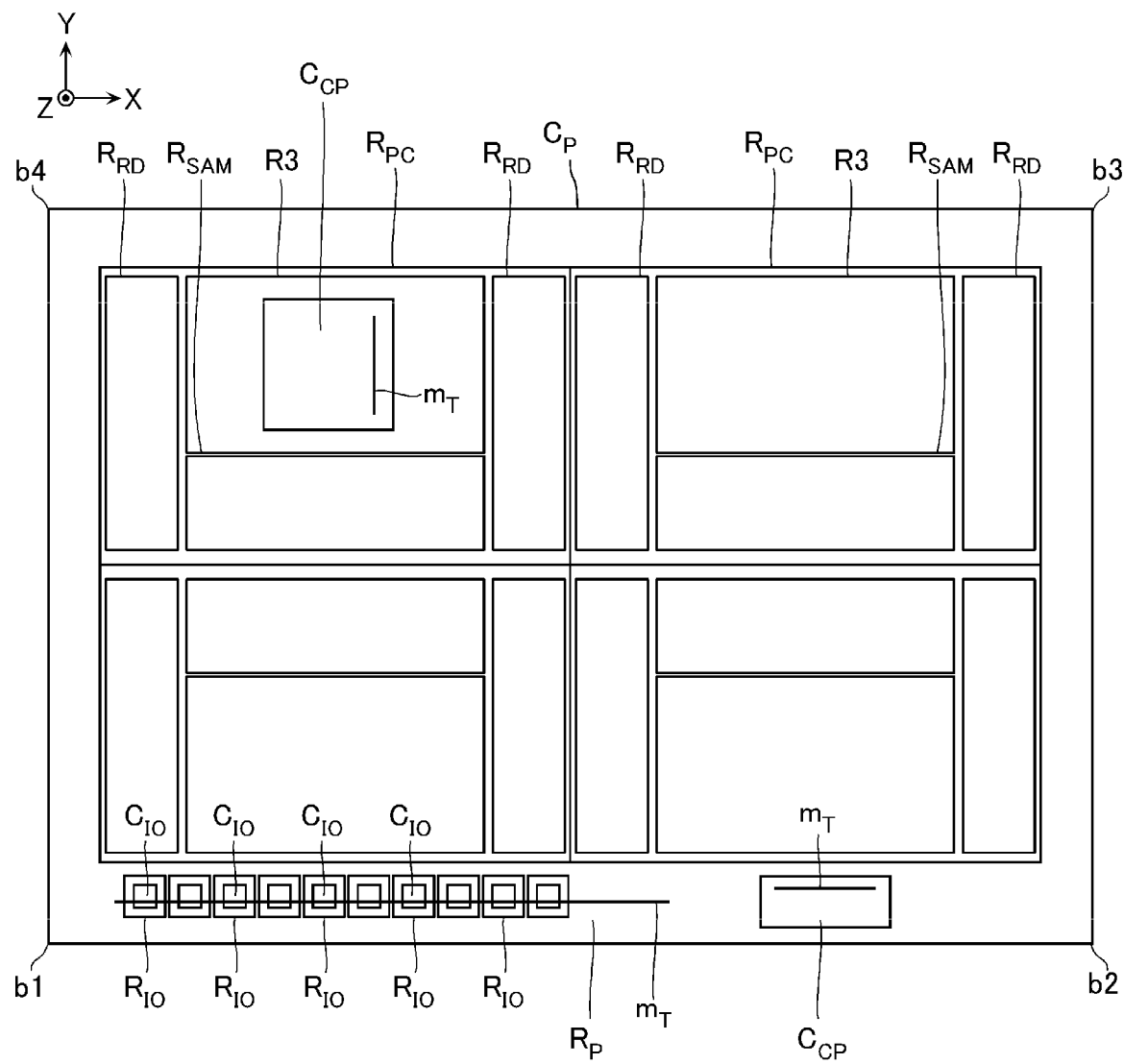
FIG. 12 depicts an example configuration of a chip in a memory die in a schematic plan view according to a first embodiment.

The interconnect $m_T$ may be provided in the vicinity of a transistor Tr which generates a relatively large amount of heat. Such a transistor Tr may, for example, constitute a charge pump circuit $C_{CP}$ or an input/output circuit $C_{IO}$ (see FIG. 12). In one instance, the transistor Tr constituting the charge pump circuit $C_{CP}$ may be provided, for example, in the region R3 as shown in FIG. 12. In that case, the interconnect $m_T$ may be provided in the region R3. In another instance, the transistor Tr constituting the charge pump circuit $C_{CP}$ may be provided, for example, in an area of the peripheral region $R_P$ lying outside the input/output circuit regions $R_{IO}$ as shown in FIG. 12. In that case, the interconnect $m_T$ may be provided in such an area. The transistor Tr constituting the input/output circuit $C_{IO}$ may be provided, for example, in the input/output circuit region $R_{IO}$ as shown in FIG. 12. In that case, the interconnect $m_T$ may be provided in the input/output circuit region $R_{IO}$.

Figure 13:
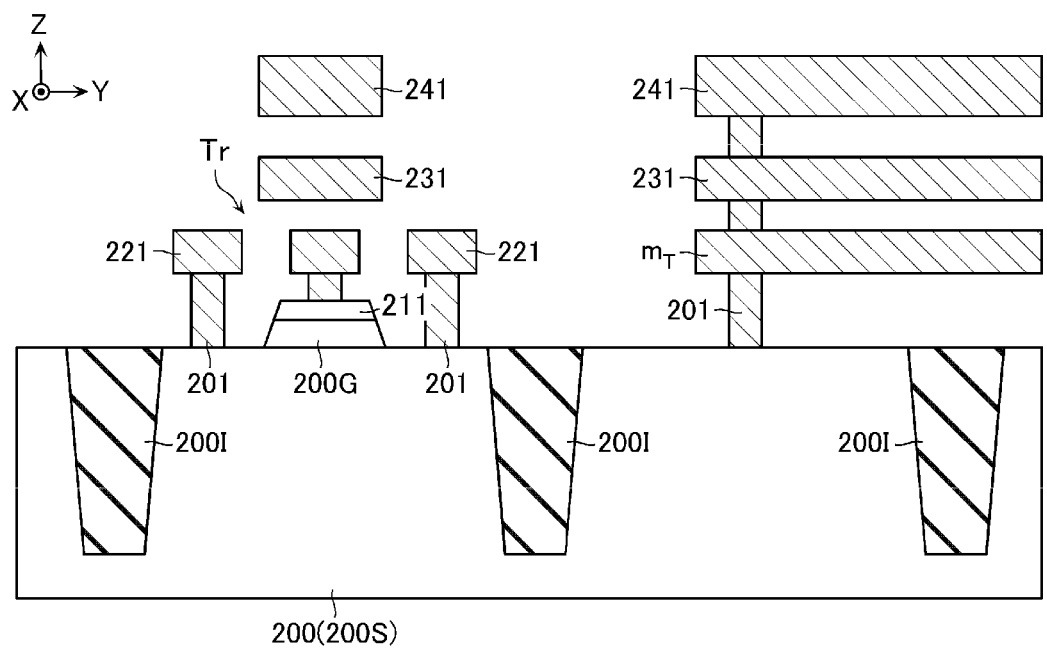
FIG. 13 depicts an example configuration of a chip in a memory die in a schematic cross-sectional view according to a first embodiment.

As shown in FIG. 13, the interconnect $m_T$ may be connected to the semiconductor substrate region 200S of the semiconductor substrate 200 via the contact 201. Such a region on the semiconductor substrate region 200S may be, for example, a region that does not function as part of the transistor Tr.

Figure 14:
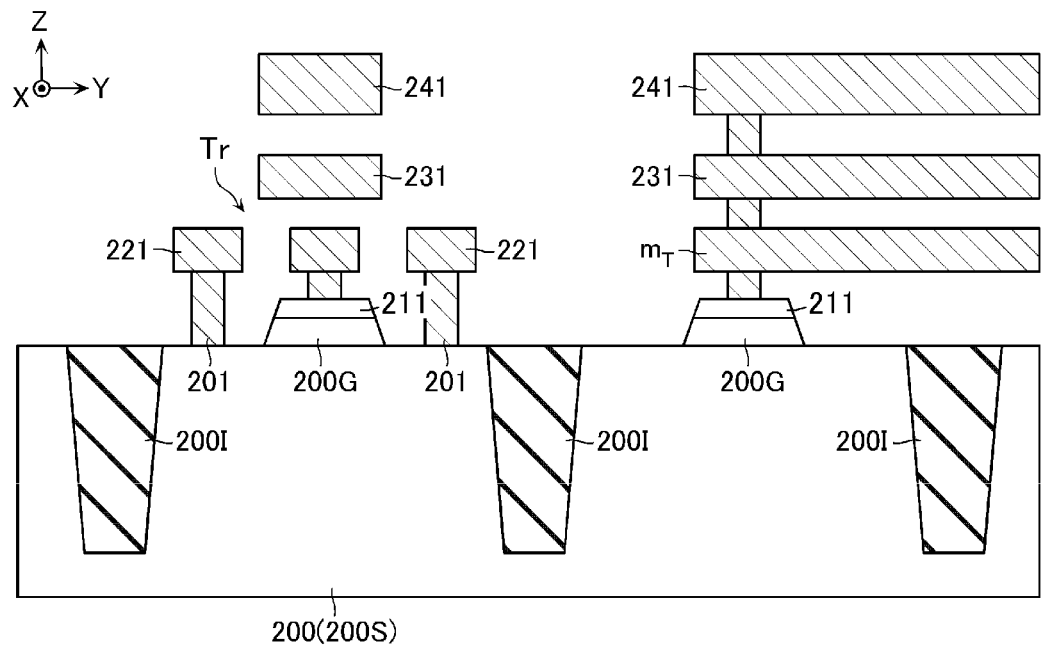
FIG. 14 depicts an example configuration of a chip in a memory die in a schematic cross-sectional view according to a first embodiment.

As shown in FIG. 14, the interconnect $m_T$ may be connected to one of the electrodes 211. Such an electrode 211 may be an electrode that does not function as part of the transistor Tr.

Such a configuration as illustrated in FIG. 13 or 14 can substantially reduce a distance between the interconnect $m_T$ and the transistor Tr. Further, since the semiconductor substrate 200 conducts heat, the heat generated by the transistor Tr can be absorbed also via the semiconductor substrate 200. This enables more efficient absorption of the heat.

Bonding Pad Electrode $P_{XT}$

Referring back to FIG. 11, the bonding pad electrode $P_{XT}$ may be one of the bonding pad electrodes $P_X$.

The bonding pad electrodes $P_X$ include, for example, bonding pad electrodes used for supply of a grounding voltage, bonding pad electrodes used for supply of an operating voltage which is higher than the grounding voltage, bonding pad electrodes used for input of data or a signal such as a clock signal, bonding pad electrodes used for control of the memory die MD, and the like. The bonding pad electrode $P_{XT}$ is, for example, one of the bonding pad electrodes $P_X$ used for the grounding voltage supply.

Bonding Electrodes $P_{f1T}$ and $P_{f2T}$

The bonding electrodes $P_{f1T}$ and $P_{f2T}$ may be some of the bonding electrodes $P_{f1}$ and $P_{f2}$.

As shown in FIG. 5, the bonding electrodes $P_{f1}$ are provided on the front surface of the chip $C_M$. As shown in FIG. 7, the bonding electrodes $P_{f2}$ are provided on the front surface of the chip $C_P$. Some of the bonding electrodes $P_{f1}$, $P_{f2}$ are provided in a current pathway (may also be referred to as a first current pathway herein) between the transistor Tr and the component (e.g., the conductive layer 110, the bit line BL, or the semiconductor layer 100) in the memory cell array MCA (see, for example, FIG. 8). Further, some of the bonding electrodes $P_{f1}$ and $P_{f2}$ are provided in a current pathway (may also be referred to as a second current pathway herein) between the bonding pad electrode $P_X$ and the transistor Tr (see, for example. FIG. 9). In the present embodiment, at least some of the bonding electrodes $P_{f1}$ and $P_{f2}$ other than the bonding electrodes $P_{f1}$ and $P_{f2}$ provided in the first and second current pathways are used as the bonding electrodes $P_{f1T}$ and $P_{f2T}$ (see, for example, FIG. 11).

The bonding electrodes $P_{f1}$ used as the bonding electrodes $P_{f1T}$ are, for example, at least some of the bonding electrodes $P_{f1}$ provided in the regions R2 of FIG. 5 or at least some of the bonding electrodes $P_{f1}$ provided in the area of the peripheral region $R_P$ lying outside the input/output circuit regions $R_{IO}$.

The bonding electrodes $P_{f1T}$ and $P_{f2T}$ used as the bonding electrodes $P_{f2T}$ are, for example, at least some of the bonding electrodes $P_{f2}$ provided in the regions R3 of FIG. 7 or at least some of the bonding electrodes $P_{f2}$ provided in the area of the peripheral region $R_P$ lying outside the input/output circuit regions $R_{IO}$.

The bonding electrodes $P_{f1T}$ and $P_{f2T}$ are electrically connected to the interconnect $m_T$ and the bonding pad electrode $P_X$T without using any transistors Tr in the memory die MD as shown in FIG. 11.

Figure 15:
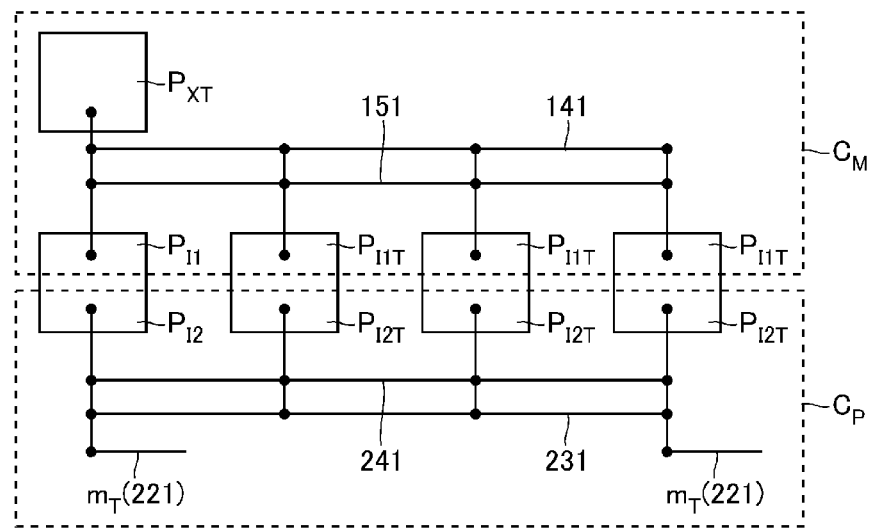
FIG. 15 is a schematic circuit diagram of an example configuration of a memory die according to a first embodiment.

At least some of the bonding electrodes $P_{f1T}$, $P_{f2T}$ may be provided in a current pathway (may also be referred to as a third current pathway herein) between the interconnect $m_T$ and the bonding pad electrode $P_{XT}$ as shown in FIG. 15.

In this case, as shown in FIGS. 11 and 15, a lower end of a contact electrode may be connected to an upper surface of at least one of the bonding electrodes $P_{f1T}$, and via this contact electrode, the bonding electrode $P_{f1T}$ may be electrically connected to some of the interconnects 141 and 151.

Further, an upper end of another contact electrode may be connected to a lower surface of the bonding electrode $P_{f2T}$, and via this contact electrode, the bonding electrode $P_{f2T}$ may be electrically connected to some of the interconnects 231 and 241. The bonding electrode $P_{f2T}$ is bonded to the bonding electrode $P_{f1T}$.

Figure 16:
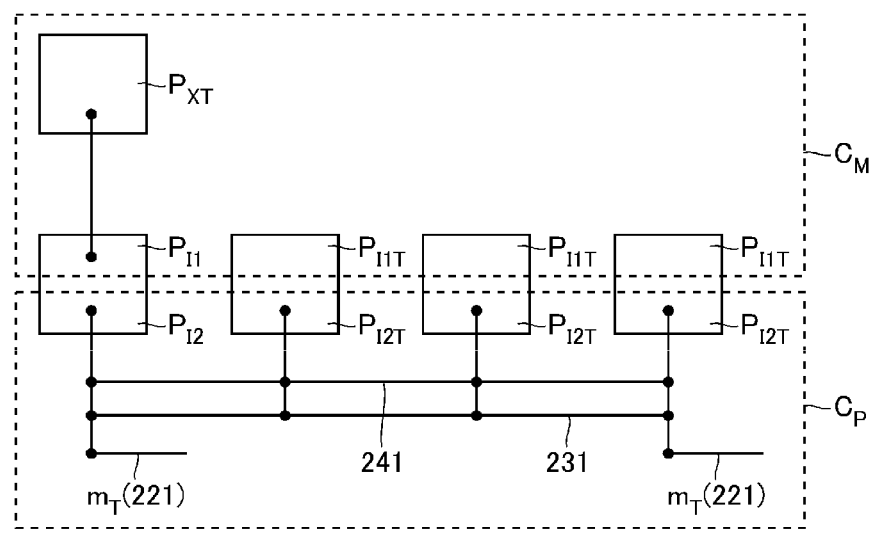
FIG. 16 is a schematic circuit diagram of an example configuration of a memory die according to a first embodiment.
Figure 17:
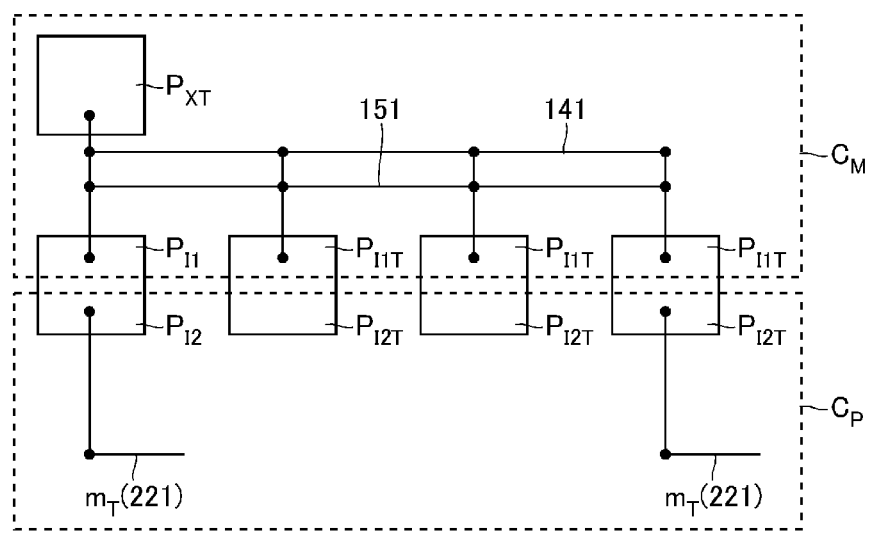
FIG. 17 is a schematic circuit diagram of an example configuration of a memory die according to a first embodiment.

At least some of the bonding electrodes PUT, $P_{f2T}$ may not be provided in the third current pathway between the interconnect $m_T$ and the bonding pad electrode $P_{XT}$ as shown in FIG. 16 or 17.

Figure 18:
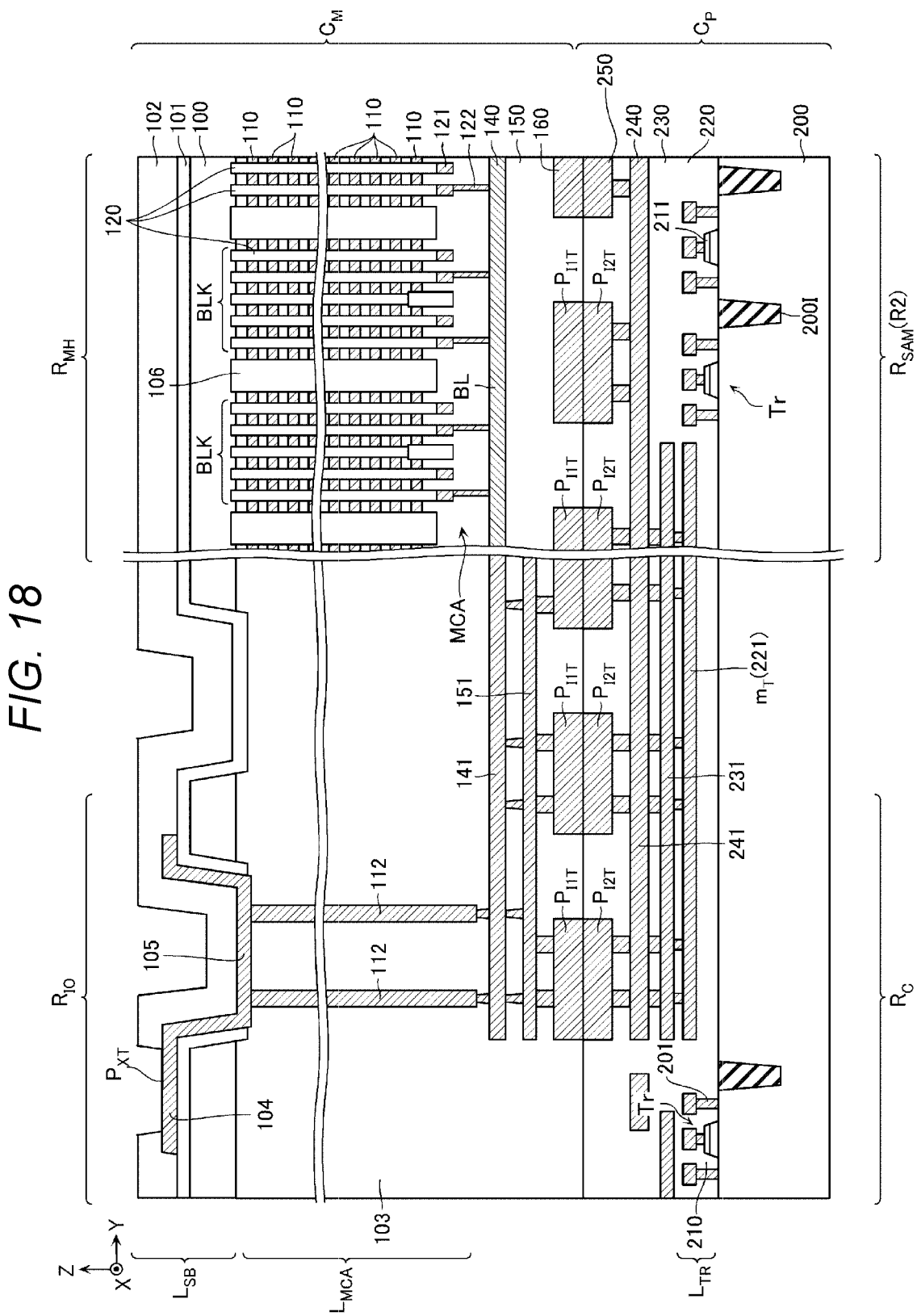
FIG. 18 depicts an example configuration of a memory die in a schematic cross-sectional view according to a first embodiment.

In this case, as shown in FIGS. 16 and 18, the contact electrode connected to the upper surface of at least one of the bonding electrodes $P_{f1T}$ in the configuration of FIGS. 11 and 15 may be omitted. For example, the bonding electrode $P_{f1T}$ in the memory hole region $R_{MH}$ in FIG. 18 does not have the contact electrode connected to the upper surface thereof. On the other hand, in a similar manner to the configuration of FIGS. 11 and 15, the bonding electrode $P_{f2T}$ may be electrically connected to some of the interconnects 231 and 241 via another contact electrode connected to the lower surface of the bonding electrode $P_{f2T}$.

Figure 19:
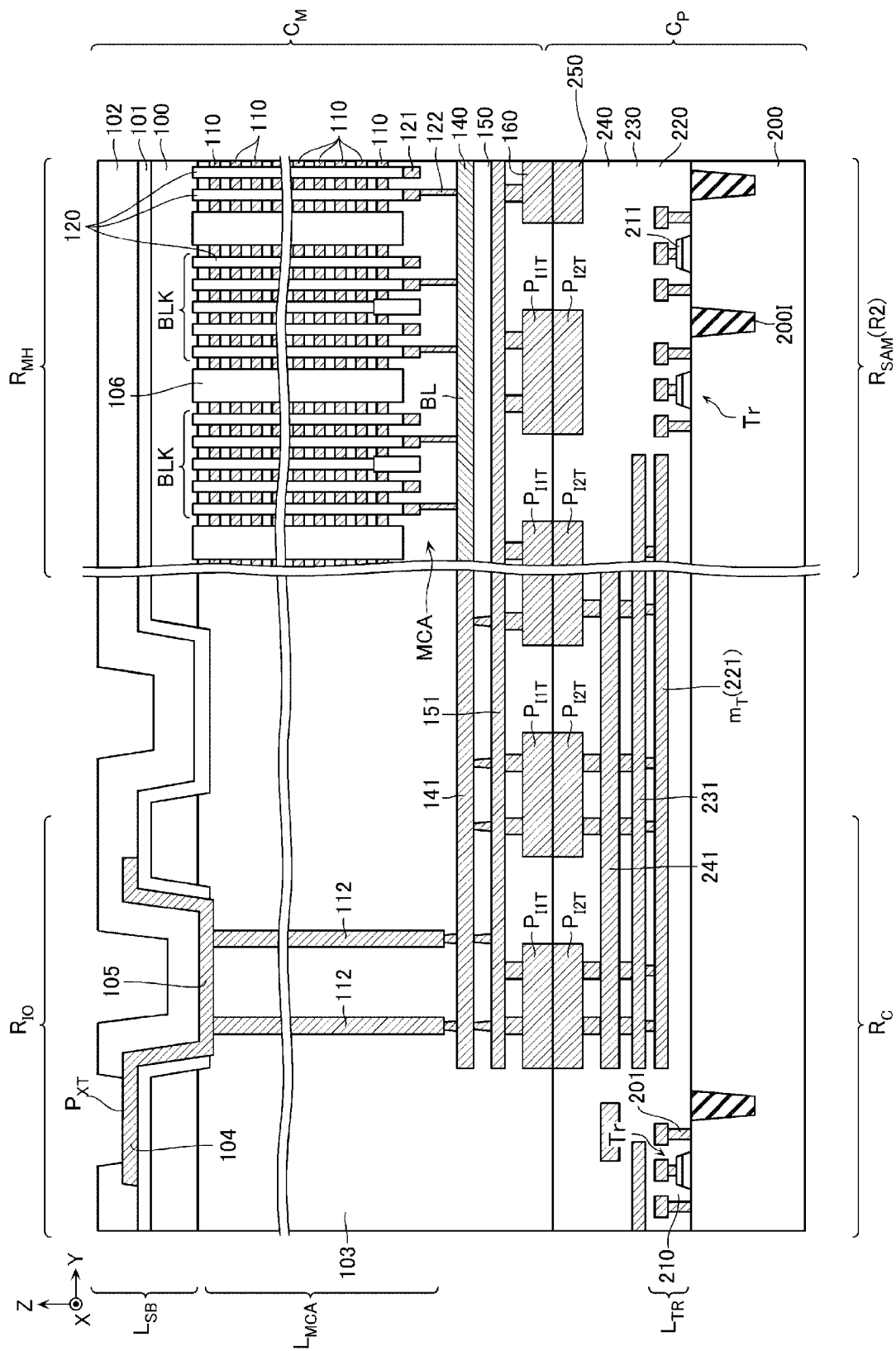
FIG. 19 depicts an example configuration of a memory die in a schematic cross-sectional view according to a first embodiment.

Alternatively, as shown in FIGS. 17 and 19, the contact electrode connected to the lower surface of the bonding electrode $P_{f2T}$ in the configuration of FIGS. 11 and 15 may be omitted. For example, the bonding electrodes $P_{f2T}$ in the memory hole region $R_{SAM}$ in FIG. 19 do not have the contact electrode connected to the lower surface thereof. On the other hand, in a similar manner to the configuration of FIGS. 11 and 15, the bonding electrode $P_{f1T}$ may be electrically connected to some of the interconnects 141 and 151 via another contact electrode connected to the upper surface of the bonding electrode $P_{f1T}$.

Other Embodiments

The configuration according to the first embodiment is one example and may be modified as appropriate or as needed.

For example, in the first embodiment, the chip $C_M$ has the three interconnect layers 140, 150, and 160, and the chip $C_P$ has the four interconnect layers 220, 230, 240, and 250. This configuration is one example and may be modified. For example, the chip $C_M$ may have four or more interconnect layers, and the chip $C_P$ may have five or more interconnect layers.

In the first embodiment, the bonding pad electrodes $P_X$ are provided in the chip $C_M$ having the memory cell array MCA. This configuration is one example and may be modified. For example, the bonding pad electrodes $P_X$ may be provided in the chip $C_P$ having the peripheral circuit.

While certain embodiments have been described, these embodiments have been presented by way of example only and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a first chip including a semiconductor substrate, a plurality of transistors, a first interconnect, and a plurality of first bonding electrodes, the first interconnect being at a position between a pair of transistors in the plurality transistors in a first direction parallel to the semiconductor substrate;
   a second chip including a memory cell array and a plurality of second bonding electrodes, the second bonding electrodes being bonded to the first bonding electrodes; and
   a plurality of bonding pad electrodes on the first chip or the second chip, the bonding pad electrodes being connectable to bonding wires, wherein
   the plurality of second bonding electrodes includes:
      third bonding electrodes that overlap the memory cell array and are in a current pathway between the memory cell array and the transistors; and
      fourth bonding electrodes that overlap the memory cell array but are not in a current pathway between the memory cell array and the transistors,
   the first interconnect is electrically connected to a bonding pad electrode in the plurality of bonding pad electrodes,
   the first interconnect is not electrically connected to any of the transistors, and
   the first interconnect is electrically connected to a fourth bonding electrode in the plurality of fourth bonding electrodes.

2. The semiconductor storage device according to claim 1, wherein the bonding pad electrode is a first bonding pad electrode connected to a ground voltage terminal.

3. The semiconductor storage device according to claim 2, wherein the plurality of bonding pad electrodes includes:
   a second bonding pad electrode for supply of a driving voltage higher than the ground voltage; and
   a third bonding pad electrode for supply of a signal.

4. The semiconductor storage device according to claim 1, wherein
   the first chip further comprises a plurality of interconnect layers, and
   the first interconnect is at least one of the interconnect layers.

5. The semiconductor storage device according to claim 4, wherein the first interconnect is the interconnect layer in the plurality that is nearest to the semiconductor substrate in a second direction orthogonal to the semiconductor substrate.

6. The semiconductor storage device according to claim 4, further comprising:
   a first contact electrode electrically connecting the first interconnect to the semiconductor substrate.

7. The semiconductor storage device according to claim 4, further comprising:
   a first electrode between the first interconnect and the semiconductor substrate; and
   a contact electrode electrically connecting the first interconnect and the first electrode.

8. A semiconductor storage device, comprising:
   a first chip including a semiconductor substrate, a plurality of transistors, a first interconnect, and a plurality of first bonding electrodes;
   a second chip including a memory cell array and a plurality of second bonding electrodes bonded to the first bonding electrodes; and
   a plurality of bonding pad electrodes on the first chip or the second chip, the bonding pad electrodes being connectable to bonding wires, wherein
   the plurality of second bonding electrodes includes:
      a plurality of third bonding electrodes that do not overlap the memory cell array but do overlap one of the bonding pad electrodes; and a plurality of fourth bonding electrodes that do not overlap either the memory cell or any one of the bonding pad electrodes, the first interconnect is electrically connected to one of the bonding pad electrodes in the plurality of bonding pad electrodes without any of the transistors being in the electrical connection between the one of the bonding pad electrodes and the first interconnect, and the first interconnect is electrically connected to a fourth bonding electrodes in the plurality of fourth bonding electrodes without any of the transistors being in the electrical connection between the fourth bonding electrode and the first interconnect, and the first interconnect is at a position between a pair of adjacent transistors in the plurality of transistors in a first direction parallel to the semiconductor substrate.

9. The semiconductor storage device according to claim 8, wherein the one of the bonding pad electrodes is a first bonding pad electrode for supply of a ground voltage.

10. The semiconductor storage device according to claim 9, wherein the plurality of bonding pad electrodes includes:
a second bonding pad electrode for supply of a driving voltage higher than the ground voltage; and
a third bonding pad electrode for supply of a signal.

11. The semiconductor storage device according to claim 8, wherein
the first chip comprises a plurality of interconnect layers, and
the first interconnect is at least one of the interconnect layers.

12. The semiconductor storage device according to claim 11, wherein the first interconnect is the interconnect layer nearest to the semiconductor substrate in a second direction orthogonal to the semiconductor substrate, and the first interconnect is at a level in the second direction from the semiconductor substrate equal to a second interconnect electrically connected to a source contact or a drain contact of at least one transistor in the plurality of transistors.

13. The semiconductor storage device according to claim 11, further comprising:
a first contact electrode electrically connecting the first interconnect and the semiconductor substrate.

14. The semiconductor storage device according to claim 11, further comprising:
a first electrode between the first interconnect and the semiconductor substrate; and
a contact electrode electrically connecting the first interconnect and the first electrode.

15. A semiconductor storage device, comprising:
a first chip including a semiconductor substrate, a plurality of transistors, a first interconnect, and a plurality of first bonding electrodes, the first interconnect being in a position between a pair of transistors in the plurality of transistors in a first direction parallel to the semiconductor substrate;
a second chip including a memory cell array and a plurality of second bonding electrodes bonded to the first bonding electrodes; and
a plurality of bonding pad electrodes on at least one of the first chip or the second chip, the bonding pad electrodes being connectable to bonding wires, wherein
the first interconnect is electrically connected to a bonding pad electrode in the plurality of bonding pad electrodes,
the first interconnect is not connected to any of the transistors, and
the first interconnect is electrically connected to at least one of the first bonding electrodes or at least one of the second bonding electrodes without any of the transistors being in the electrical connection between the at least one of the first bonding electrodes or the at least one of the second bonding electrodes.

16. The semiconductor storage device according to claim 15, wherein the one of the bonding pad electrodes is a first bonding pad electrode for supply of a ground voltage.

17. The semiconductor storage device according to claim 16, wherein the plurality of bonding pad electrodes includes:
a second bonding pad electrode for supply of a driving voltage higher than the ground voltage; and
a third bonding pad electrode for supply of a signal.

18. The semiconductor storage device according to claim 15, wherein
the first chip comprises a plurality of interconnect layers, and
the first interconnect comprises the interconnect layer in the nearest to the semiconductor substrate.

19. The semiconductor storage device according to claim 18, further comprising:
a first contact electrode electrically connecting the first interconnect and the semiconductor substrate.

20. The semiconductor storage device according to claim 18, further comprising:
a first electrode between the first interconnect and the semiconductor substrate; and
a contact electrode electrically connecting the first interconnect and the first electrode.

* * * * *